US010199456B2

(12) United States Patent
Jin et al.

(10) Patent No.: US 10,199,456 B2
(45) Date of Patent: Feb. 5, 2019

(54) METHOD OF MANUFACTURING A SEMICONDUCTOR DEVICE HAVING A CHARGE COMPENSATION REGION UNDERNEATH A GATE TRENCH

(71) Applicant: Infineon Technologies Austria AG, Villach (AT)

(72) Inventors: Minghao Jin, Villach (AT); Li Juin Yip, Villach (AT); Oliver Blank, Villach (AT); Martin Vielemeyer, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/251,606

(22) Filed: Aug. 30, 2016

(65) Prior Publication Data

US 2016/0372538 A1     Dec. 22, 2016

Related U.S. Application Data

(62) Division of application No. 14/554,193, filed on Nov. 26, 2014, now Pat. No. 9,443,973.

(51) Int. Cl.
*H01L 29/78*     (2006.01)
*H01L 29/40*     (2006.01)
*H01L 29/66*     (2006.01)
*H01L 29/06*     (2006.01)
(Continued)

(52) U.S. Cl.
CPC .......... *H01L 29/063* (2013.01); *H01L 21/266* (2013.01); *H01L 21/2652* (2013.01);
(Continued)

(58) Field of Classification Search
CPC ........... H01L 21/30604; H01L 21/3081; H01L 21/266; H01L 21/306; H01L 21/308;
(Continued)

(56) References Cited

U.S. PATENT DOCUMENTS 5,929,481 A  *   7/1999  Hshieh ................ H01L 29/0878
                                                              257/328
6,649,975 B2 *  11/2003  Baliga .................. H01L 23/552
                                                              257/327
(Continued)

FOREIGN PATENT DOCUMENTS

CN         1864270 A    11/2006
CN       101180737 A     5/2008
(Continued)

*Primary Examiner* — Marc Armand
*Assistant Examiner* — Younes Boulghassoul
(74) *Attorney, Agent, or Firm* — Murphy, Bilak & Homiller, PLLC

(57) ABSTRACT

A method of forming a semiconductor device is provided. The device includes a semiconductor substrate having a main surface and a rear surface vertically spaced apart from the main surface, a first doped region, a second doped region and a third doped region. The third doped region is interposed between the first and second doped regions beneath the main surface. Field plate trenches having field plates vertically extend from the main surface to a bottom that is arranged in the first doped region. A gate trench having a gate electrode vertically extends from the main surface to the first doped region. A compensation zone vertically extends from the bottom of the gate trench deeper into the first doped region. The compensation zone is laterally aligned with the gate trench and is adjacent to the field plates along a cross-sectional plane of the device that is parallel to the main surface.

12 Claims, 13 Drawing Sheets

(51) Int. Cl.
*H01L 21/306* (2006.01)
*H01L 21/308* (2006.01)
*H01L 21/266* (2006.01)
*H01L 21/265* (2006.01)
*H01L 29/10* (2006.01)
*H01L 29/739* (2006.01)

(52) U.S. Cl.
CPC .... *H01L 21/3081* (2013.01); *H01L 21/30604* (2013.01); *H01L 29/0623* (2013.01); *H01L 29/0634* (2013.01); *H01L 29/0696* (2013.01); *H01L 29/1095* (2013.01); *H01L 29/401* (2013.01); *H01L 29/404* (2013.01); *H01L 29/407* (2013.01); *H01L 29/66734* (2013.01); *H01L 29/7397* (2013.01); *H01L 29/7811* (2013.01); *H01L 29/7813* (2013.01)

(58) Field of Classification Search
CPC . H01L 21/3205; H01L 21/336; H01L 21/265; H01L 21/2652; H01L 21/3065; H01L 29/7811; H01L 29/0634; H01L 29/404; H01L 29/7813; H01L 29/0684; H01L 29/0878; H01L 29/0649; H01L 29/10; H01L 29/78; H01L 29/40; H01L 29/06; H01L 29/66; H01L 29/76; H01L 29/36; H01L 29/0865; H01L 29/0882; H01L 29/4236; H01L 29/66537; H01L 29/0653; H01L 29/408; H01L 29/7809; H01L 29/7827; H01L 29/7835; H01L 29/063; H01L 29/401; H01L 29/1095; H01L 29/66712–29/66734; H01L 29/7802–29/7815; H01L 29/66613–29/66628; H01L 29/7397; H01L 29/402–29/407
USPC ....... 257/341, 331, 330, 333, 332, 328, 329, 257/327, 335, 340, 339, 342, 409, 509, 257/510, 513, 514, 607, 365, 492, 493, 257/262; 438/259, 587, 212, 525, 270
See application file for complete search history.

(56) References Cited

U.S. PATENT DOCUMENTS

| | | | |
|---|---|---|---|
| 6,710,403 B2 * | 3/2004 | Sapp | H01L 29/407 257/228 |
| 6,858,895 B2 | 2/2005 | Feldtkeller et al. | |
| 7,345,342 B2 * | 3/2008 | Challa | H01L 21/3065 257/331 |
| 7,453,119 B2 | 11/2008 | Bhalla et al. | |
| 7,534,683 B2 * | 5/2009 | Shenoy | H01L 29/0623 438/270 |
| 7,750,397 B2 | 7/2010 | Hirler et al. | |
| 7,777,274 B2 | 8/2010 | Mauder et al. | |
| 7,928,505 B2 | 4/2011 | Hirao et al. | |
| 7,960,781 B2 * | 6/2011 | Loechelt | H01L 29/0634 257/329 |
| 8,022,474 B2 * | 9/2011 | Haeberlen | H01L 29/7805 257/331 |
| 8,247,865 B2 * | 8/2012 | Hirler | H01L 29/407 257/329 |
| 8,803,205 B2 * | 8/2014 | Willmeroth | H01L 27/088 257/262 |
| 8,829,607 B1 * | 9/2014 | Hsieh | H01L 29/41766 257/329 |
| 8,907,412 B2 | 12/2014 | Darwish | |
| 9,443,972 B2 | 9/2016 | Blank | |
| 2003/0094669 A1 * | 5/2003 | Nakashima | H01L 21/763 257/506 |
| 2004/0021173 A1 | 2/2004 | Sapp | |
| 2004/0121572 A1 * | 6/2004 | Darwish | H01L 21/2253 438/589 |
| 2005/0001264 A1 * | 1/2005 | Ono | H01L 29/407 257/330 |
| 2009/0039419 A1 | 2/2009 | Zundel et al. | |
| 2012/0175699 A1 * | 7/2012 | Hsieh | H01L 29/1095 257/332 |
| 2013/0256786 A1 | 10/2013 | Hsieh | |
| 2014/0097517 A1 * | 4/2014 | Moens | H01L 29/36 257/607 |
| 2015/0349113 A1 | 12/2015 | Katoh et al. | |
| 2016/0013280 A1 | 1/2016 | Laforet et al. | |
| 2016/0035882 A1 | 2/2016 | Vielemeyer et al. | |

FOREIGN PATENT DOCUMENTS

| | | |
|---|---|---|
| CN | 102097378 A | 6/2011 |
| CN | 103137494 A | 6/2013 |
| CN | 103165604 A | 6/2013 |
| DE | 10224201 B4 | 1/2004 |
| DE | 102012223663 A1 | 6/2013 |
| DE | 102013105060 A1 | 11/2013 |
| JP | 63296282 A | 12/1988 |

* cited by examiner

METHOD OF MANUFACTURING A SEMICONDUCTOR DEVICE HAVING A CHARGE COMPENSATION REGION UNDERNEATH A GATE TRENCH

TECHNICAL FIELD

The instant application relates to semiconductor devices and in particular relates to compensation techniques for improving the tradeoff between on-resistance and breakdown voltage in power switching devices.

BACKGROUND

Semiconductor transistors, in particular field-effect controlled switching devices such as Metal Oxide Semiconductor Field Effect Transistors (MOSFET) and Insulated Gate Bipolar Transistors (IGBT) have been used in a wide variety of applications such as power supplies, power converters, electric cars and air-conditioners. Many of these applications are high power applications, which require the transistors to be able to accommodate substantial current and/or voltage. In high power applications, two device parameters that play a substantial role in overall performance of the device are on-state resistance $R_{ON}$ and breakdown voltage $V_{BR}$. Lower on-state resistance $R_{ON}$ is a desirable characteristic for a power transistor because it minimizes the resistive power loss (and corresponding heat generation) that occurs when the device is in a forward conducting state. Meanwhile, high breakdown voltage $V_{BR}$ is a desirable characteristic for a power transistor because ensures that the device will remain in an off-state under the presence of large reverse voltages.

Vertical transistors are commonly utilized in high power applications due to the favorable on-state resistance $R_{ON}$ and breakdown voltage $V_{BR}$ characteristics that that these devices offer. Vertical devices are configured to conduct current in a direction perpendicular to the surfaces of the semiconductor substrate. Typically, these devices include a drift region in the substrate between the output regions (e.g., source/drain regions). By lowering the doping concentration of the drift region, the likelihood of avalanche breakdown in the device can be reduced and consequently the reverse blocking capability of the device can be improved. However, lowering the doping concentration of the drift region comes at the expense of an increased on-state resistance $R_{ON}$, because it lowers the concentration of carriers available for conduction when the device is in the on-state.

By improving the tradeoff between on-state resistance $R_{ON}$ and breakdown voltage $V_{BR}$, it is possible to lower the on-state resistance $R_{ON}$ of the device while maintaining reverse blocking capability. Alternatively, an improvement to this tradeoff can be utilized to provide a device with increased reverse blocking capability while maintaining the on-state resistance $R_{ON}$ of the device.

One technique that is utilized to favorably shift the tradeoff between on-state resistance $R_{ON}$ and breakdown voltage $V_{BR}$ in a transistor involves taking advantage of the compensation principle. The compensation principle is based on a mutual compensation of charges in the device. Compensation structures can be provided at or near the drift region to produce opposite type carriers as those carriers that are present in a space charge region that forms in the drift region when the device is reverse biased.

One application of the compensation principle in power switching devices involves providing field plates in the device that vertically extend into the drift region. The field plates can be biased such that they introduce compensating charges into the drift region in a reverse-blocking state. However, field plates are not completely effective at eliminating the electric fields that cause avalanche breakdown.

SUMMARY

A semiconductor device is disclosed. According to an embodiment, the semiconductor device includes a semiconductor substrate having a main surface and a rear surface vertically spaced apart from the main surface, a first doped region, a second doped region and a third doped region. The second and third doped regions are formed in the first doped region. The second doped region extends from the main surface into the substrate. The third doped region is interposed between the first and second doped regions beneath the main surface. First and second field plate trenches vertically extend from the main surface to a bottom that is arranged in the first doped region. First and second field plates are arranged in the first and second field plate trenches, respectively, and are dielectrically insulated from the substrate. A gate trench is laterally arranged between the first and second field plate trenches and vertically extends from the main surface through the second and third doped regions so that a bottom of the trench is arranged in the first doped region. A gate electrode is arranged in the gate trench is dielectrically insulated from the substrate. The gate electrode is configured to control an electrically conductive channel in the third doped region. A compensation zone vertically extends from the bottom of the gate trench deeper into the first doped region. The compensation zone is laterally aligned with the gate trench. The compensation zone is adjacent to the field plates along a cross-sectional plane of the device that is parallel to the main surface. The first and second doped regions have a first conductivity type, and the third doped region and the compensation zone have a second conductivity type.

A power transistor is disclosed. According to an embodiment, the power transistor includes a semiconductor substrate having a main surface and a rear surface vertically spaced apart from the main surface, a drift region, a source region, and a body region. The source region and the body region are formed in the drift region. The source region extends from the main surface into the substrate. The body region is interposed between the source region and the drift region beneath the main surface. First and second field plate trenches vertically extend from the main surface to a bottom that is arranged in the drift region. First and second field plates are arranged in the first and second field plate trenches, respectively, and are dielectrically insulated from the substrate. A gate trench is laterally arranged between the first and second field plate trenches and vertically extends from the main surface through the source region and the body region so that the gate trench has a bottom arranged in the drift region. A gate electrode is arranged in the gate trench and is dielectrically insulated from the substrate. The gate electrode is configured to control an electrically conductive channel in the body region. A compensation zone vertically extends from the bottom of the gate trench deeper into the drift region. The compensation zone is laterally aligned with the gate trench. The compensation zone is adjacent to the field plates along a cross-sectional plane of the device that is parallel to the main surface.

A method of forming a semiconductor device is disclosed. According to an embodiment, the method includes forming a semiconductor substrate having a main surface and a rear surface vertically spaced apart from the main surface, a first doped region, a second doped region and a third doped region. The second and third doped regions are formed in the first doped region. The second doped region extends from the main surface into the substrate. The third doped region is interposed between the first and second doped regions beneath the main surface. The method further includes forming first and second field plate trenches vertically extending from the main surface to a bottom that is arranged in the first doped region. The method further includes forming first and second field plates arranged in the first and second field plate trenches, respectively, and being dielectrically insulated from the substrate. The method further includes forming a gate trench laterally arranged between the first and second field plate trenches and vertically extending from main surface through the second and third doped regions so that the gate trench has a bottom arranged in the first doped region. The method further includes forming a gate electrode arranged in the gate trench and being dielectrically insulated from the substrate, the gate electrode being configured to control an electrically conductive channel in the third doped region. The method further includes forming a compensation zone vertically extending from the bottom of the gate trench deeper into the first doped region. The method is carried out such that the compensation zone is laterally aligned with the gate trench and is adjacent to the field plates along a cross-sectional plane of the device that is parallel to the main surface. The first and second doped regions have a first conductivity type, and the third doped region and the compensation zone have a second conductivity type.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
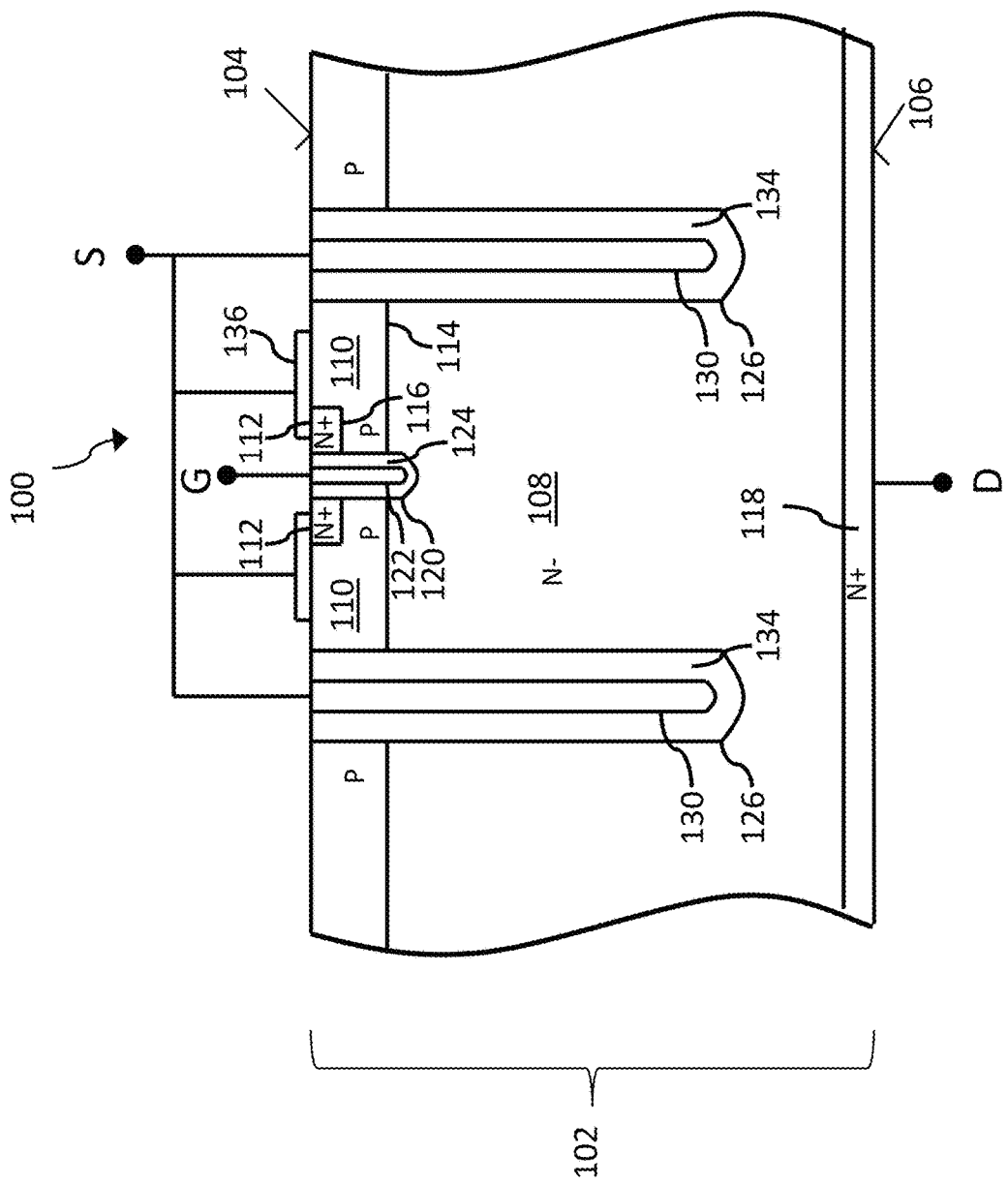
FIG. 1 illustrates a cross-sectional view of a semiconductor device having a trench-gate interposed between a pair of compensating field plates, according to an embodiment.

Referring to FIG. 1, a cross-sectional view of a charge compensating semiconductor device 100 is depicted. The semiconductor device 100 is formed in a semiconductor substrate 102. The substrate 102 includes a main surface 104 and a rear surface 106 vertically spaced apart from the main surface 104. That is, the main surface 104 and the rear surface 106 are arranged opposite to one another. The substrate 102 includes a first doped region 108, a second doped region 110 and a third doped region 112. The second and third doped regions 110, 112 may be formed within the first doped region 108. For example, the first doped region 108 may be formed from a lightly doped epitaxial layer, and the second and third doped regions 110, 112 may be implanted or diffused regions that are more highly doped than the first doped region 108. The third doped region 112 extends from the main surface 104 into the substrate 102. The second doped region 110 is interposed between the first and third doped regions 108, 112 beneath the main surface 104. The first and third doped regions 108, 112 have a first conductivity type majority carrier concentration (e.g., n-type) and the second doped region 110 has a second conductivity type majority carrier concentration (e.g., p-type). Thus, the device 100 includes two p-n junctions beneath the main surface 104. A first p-n junction 114 is between the first and second doped regions 108, 110 beneath the main surface 104 and a second p-n junction 116 is between the second and third doped regions 110, 112 beneath the main surface 104.

According to an embodiment, the device 100 is an n-channel MOSFET in which the first doped region 108 is an n-type drift region, the second doped region 110 is a p-type body region, and the third doped region 112 is n-type source region. The device further includes an n-type drain region 118 that extends from the rear surface 106 into the semiconductor substrate 102. The drain region 118 is coupled to the drift region 108, either directly or indirectly. For example, an n-type field stop region (not shown) that is more highly doped than the drift region 108 may be interposed between the drain region 118 and the drift region 108.

The device 100 may be configured vertical device with a gate trench 120 vertically extending from the main surface 104 into the semiconductor substrate 102. The gate trench 120 vertically extends through the source region 112 and through the body region 110 so that a bottom of the trench 120 is arranged in the drift region 108. The gate trench 120 is directly adjacent to the first and second p-n junctions 114, 116.

A gate electrode 122 is arranged in the gate trench 120. The gate electrode 122 is formed from an electrically conductive material, such as polysilicon or a conductive metal (e.g., aluminum or tungsten). The gate electrode 122 is dielectrically insulated from the substrate 102 by a gate dielectric 124. The gate dielectric 124 may be a layer of oxide such as $SiO_2$ that is formed in the gate trench 120.

The gate trench 120 is laterally arranged between first and second field plate trenches 126. The first and second field plate trenches 126 vertically extend from the main surface 104 into the semiconductor substrate 102. Bottoms of the first and second field plate trenches are arranged in the drift region 108.

First and second field plates 130 are arranged in the first and second field plate trenches 126, respectively. The first and second field plates 130 are formed from an electrically conductive material, such as polysilicon or a conductive metal (e.g., aluminum or tungsten). The first and second field plates 130 are dielectrically insulated from the substrate 102 by a field dielectric 134. The field dielectric 134 may be a layer of oxide such as $SiO_2$ that is formed in the field plate trenches 126.

According to an embodiment, the source region 112 is connected to a source potential by a source electrode 136. As shown in FIG. 1, the source electrode 136 is arranged at the main surface 104 and extends over the body region 110 so as to connect both of the source and body regions 112, 110 to the source potential. Alternatively, the source region 112 may be contacted to the source potential from a lateral side. The drain region 118 may be connected to a drain potential by a drain electrode (not shown). The drain electrode may be formed on the rear surface 106. Alternatively, the drain electrode may be formed on the main surface 104 and connected to the drain region 118 by a through-contact.

In a commonly known manner, the gate electrode 122 is configured to control an electrically conductive channel in the body region 110 and carry out a switching operation for the device 100. For example, the gate electrode 122 can be biased relative to a source potential to form or remove an electrically conductive channel in the body region 110 thereby providing ON/OFF control of the device 100.

When the device 100 is in a reverse blocking-state, that is, when the device 100 is switched OFF and the first p-n junction 114 is reverse biased, a space charge zone (i.e., a depletion region) extends from the first p-n junction 114 into the drift region 108. As the device 100 becomes more reverse biased, the space charge zone propagates further into the drift region 108 and towards the drain region 118. Positively charged donors present in the drift region 108 portion of the space charge zone are drawn towards negatively charged acceptors present in the body region 110 portion of the space charge zone. Thus, as a reverse voltage applied to the device 100 increases, an electric field builds in the space charge zone at the first p-n junction 114 due to the mutual attraction between the charges present on either side of the first p-n junction 114. If the electric field reaches the critical field strength $E_c$ of the semiconductor material, avalanche breakdown occurs, and the device 100 is no longer able to block the reverse voltage.

To mitigate the above described phenomenon, the device 100 includes the field plates 130 extending into the drift region 108 adjacent to the conduction path. The field plates 130 are configured to provide compensating charges adjacent to the drift region 108. The field plates 130 may be biased such that compensating charges are present in the field plates 130 when the device 100 is in a reverse blocking state. For example, the field plates 130 may be connected to a source potential by a contact (not shown) extending from the main surface 104. Thus, when the device 100 is in a reverse-blocking state, there is a capacitive coupling between the positively charged donors present in the drift region 108 and the negative charges in the field plates 130 that lessens the gradient of the electric field in the space charge region.

Figure 2:
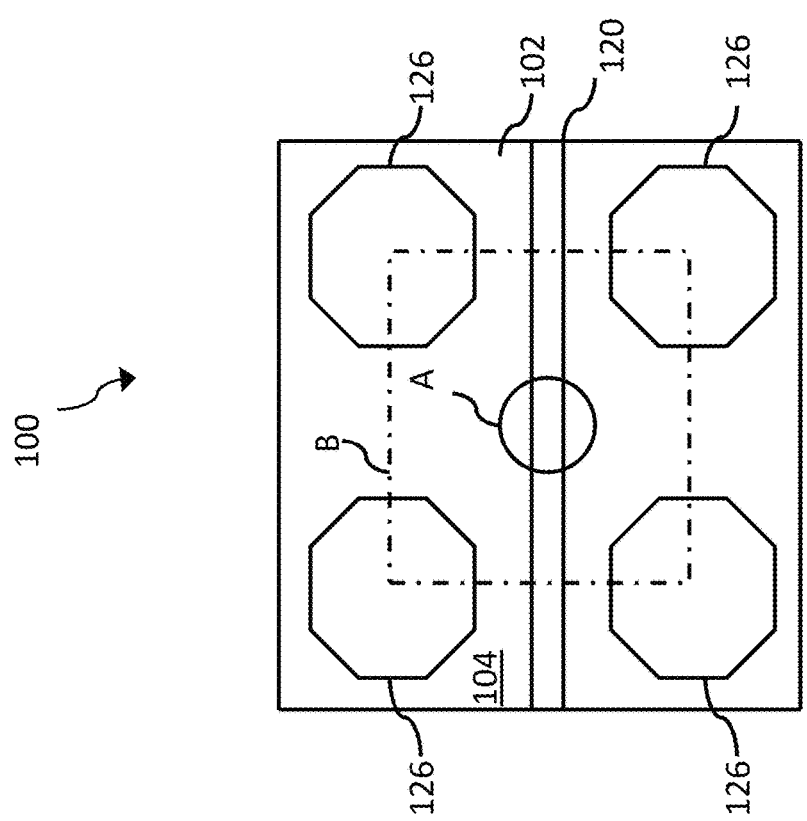
FIG. 2 depicts a plan-view configuration of the trench-gate and the field plates in the device of FIG. 1, according to an embodiment.

Referring to FIG. 2, a possible configuration of the device 100 is depicted from a plan-view perspective. FIG. 2 depicts one cell of the device 100 that can be replicated multiple times (e.g., tens, hundreds, thousands, etc.) in a single substrate 102. The gate trench 120 laterally extends between two sides of the cell and may be a continuous structure that extends across multiple adjacent cells. A plurality of the cells may be used to form a single device (e.g. MOSFET, IGBT, diode, etc.). Further, multiple devices may be formed, with each of the devices including one or more of the cells.

In the device 100 of FIG. 2, there is a plurality of field plate trenches 126 occurring at regular intervals adjacent to the gate trench 120. According to an embodiment, one cell of the device 100 includes first, second, third and fourth field plate trenches 126. The third and fourth field plate trenches 126 may be configured similarly or identical as the first and second field plate trenches 126 disclosed with reference to FIG. 1. That is, the third and fourth field plate trenches 126 extend from the main surface 104 to a bottom that is arranged in the drift region 108. Further, third and fourth field plates 130 are arranged in the third and fourth field plate trenches 126, respectively, and are dielectrically insulated from the substrate 102 in the manner previously described.

Figure 3:
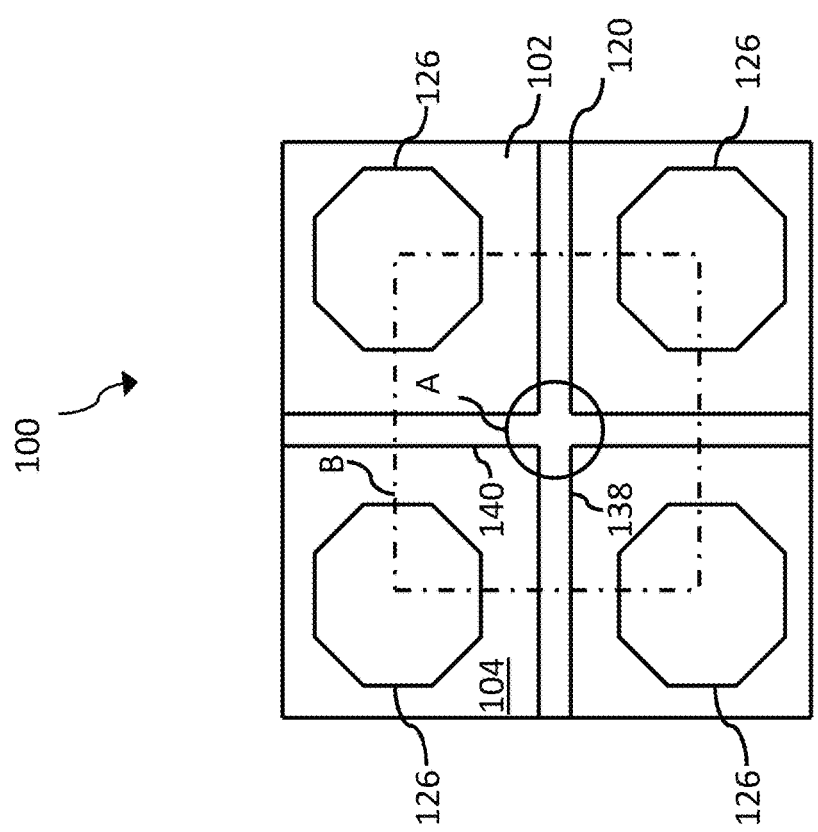
FIG. 3 depicts a plan-view configuration of the trench-gate and the field plates in the device of FIG. 1, according to another embodiment.

Referring to FIG. 3, a plan-view perspective of one cell of the device 100 according to another embodiment is shown. In the embodiment of FIG. 3, the gate trench 120 includes first and second lateral portions 138, 140 that form an intersection with one another. That is, the gate trench 120 extends along the main surface 104 in two different lateral directions and converges at the intersection. According to an embodiment, the first and second lateral portions 138, 140 of the gate trench 120 are orthogonal to one another such that the gate trench 120 forms ninety degree angles at the intersection. Alternatively, the first and second lateral portions 138, 140 may form an oblique angle at the intersection.

In the embodiment of FIG. 3, the field plate trenches 126 each form a closed loop in a plane parallel to the main surface 104. A closed loop can be any non-linear shape, such as an oval, circle, rectangle, polygon, etc. in which the sidewalls of the trench are circuitous. For example, the trenches shown in FIGS. 2 and 3 are configured as octagons. These trenches may be so-called "needle trenches" as described by U.S. Pat. No. 8,247,865 to Hirler, the content of which is incorporated by reference in its entirety. The field plate trenches 126 may have tapered sidewalls. That is, the field plate trenches 126 may widen or narrow in the vertical direction.

Advantageously, the layouts depicted in FIGS. 2 and 3 provide a space-efficient configuration for a switching device with favorable on-resistance $R_{ON}$ and breakdown voltage $V_{BR}$ characteristics. The layout of the gate trenches 120 provides expansive channel widths, which provide increased conduction and lower on-resistance $R_{ON}$. Further, the layout of the gate trenches 120 efficiently utilizes the available area of the substrate 102. Meanwhile, the field plate trenches 126 can be can be easily patterned across the substrate 102 at close distances to the gate trench 120.

Although the device 100 depicted in FIGS. 2 and 3 includes compensation structures, further compensation is possible and is beneficial to overall device performance. In the depicted configuration, the compensating effect of the field plates 130 is not uniform throughout the device 100. That is, there are areas of the drift region 108 in which the field plates 130 are not as effective at compensating for charges during reverse blocking. These areas correspond to portions of the drift region 108 that are spaced furthest away from the field plates 130. The charges in this portion of the drift region 108 are least influenced by the compensating charges present in the field plates and are more attracted to charges in the body region 110.

FIGS. 2 and 3 include a circle A indicating the portions of the device 100 in which the compensating effect of the field plates 130 is at minimum. The circle A identifies a portion of the substrate 102 that is equidistant to the field plate trenches 126. The circle A does not indicate a particular boundary per se, and instead indicates a region. That is, the radius of the circle A depicted in FIGS. 2 and 3 is not indicative of any sort of threshold. The radius of the circle A may be increased or decreased and the circle A may nonetheless encompass the region that is equidistant to the field plate trenches 126, provided that the center of the circle A is located at an absolute maximum to the field plate trenches 126.

The center of the circle A that is equidistant to the field plate trenches 126 can be defined with reference a rectangle B that is formed by the field plate trenches 126. The corners of the rectangle are defined by the respective center points of the closed loops formed by the first, second, third and fourth field plate trenches 126. The center of this rectangle B is equidistant to the first, second, third and fourth field plates 130, which are centrally located within the field plate trenches 126. In FIGS. 2 and 3, the rectangle B has been superimposed over the main surface 104. However, the rectangle B is located beneath the main surface 104 and is used to define a portion of the drift region 108 underneath the gate trench 120.

Figure 4:
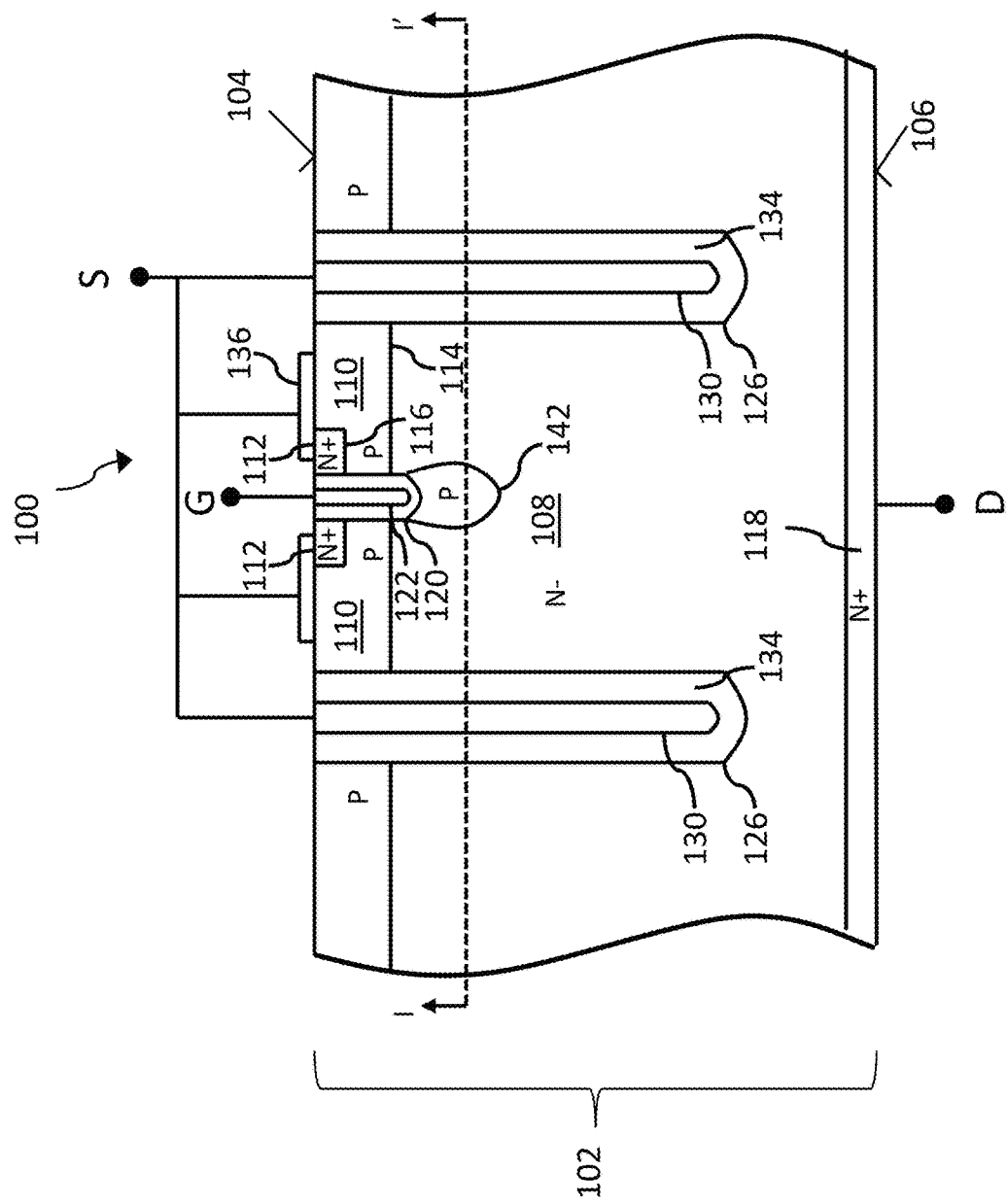
FIG. 4 depicts a cross-sectional view of a semiconductor device having a compensation zone arranged underneath the gate trench, according to an embodiment.

Referring to FIG. 4, a device 100 having enhanced compensation capability is depicted. The device 100 of FIG. 4 is identical to the device 100 of FIG. 1, except that it includes a compensation zone 142 arranged underneath the gate trench 120. In a device 100 having the field plate configurations shown in FIGS. 2-3, the compensation zone 142 can be advantageously located at portions of the drift region 108 in which the compensation effect of the field plates 130 is minimized.

The compensation zone 142 is doped oppositely from the drift region 108. For example, if the drift region 108 is an n-type region, the compensation zone 142 is a p-type region. Due to the presence of the compensation zone 142, there is greater p-n charge balance in the drift region 108 portion of the device 100. Thus, the tradeoff between on-resistance $R_{ON}$ and breakdown voltage $V_{BR}$ can be improved in the device 100. For example, the doping concentration of the drift region 108 can be increased, which leads to a lower on-resistance $R_{ON}$. Meanwhile, the breakdown voltage $V_{BR}$ rating of the device 100 is maintained in comparison to a comparable device without the compensation zone 142 because there is less attraction between charges in a vertical direction of the device 100.

The compensation zone 142 vertically extends from the bottom of the gate trench 120 deeper into the drift region 108. According to an embodiment, a bottom of the compensation zone 142 is spaced closer to the main surface 104 than the bottoms of the first and second field plate trenches 126. For example, the field plate trenches 126 may extend across a majority (i.e., 50, 75 or even 100 percent) of the vertical thickness of the drift region 108. By contrast, the compensation zone 142 may be configured such that a bottom of the compensation zone 142 is spaced apart from the first p-n junction 114 by a distance of between ten and fifty percent of a thickness of the drift region.

According to an embodiment, the compensation zone 142 is adjacent to the field plates 130 along a cross-sectional plane of the device 100 that is parallel to the main surface 104. For example, as shown in FIG. 4, the cross-sectional line I-I intersects with both the compensation zone 142 and the field plates 130.

According to an embodiment, only the gate electrode 122 and the gate dielectric 120 are arranged in the gate trench 120. Thus, the device 100 can be produced at lower cost and complexity in comparison to a device having other conductors (e.g., field electrodes) situated in the situated in the gate trench 120.

Figure 5:
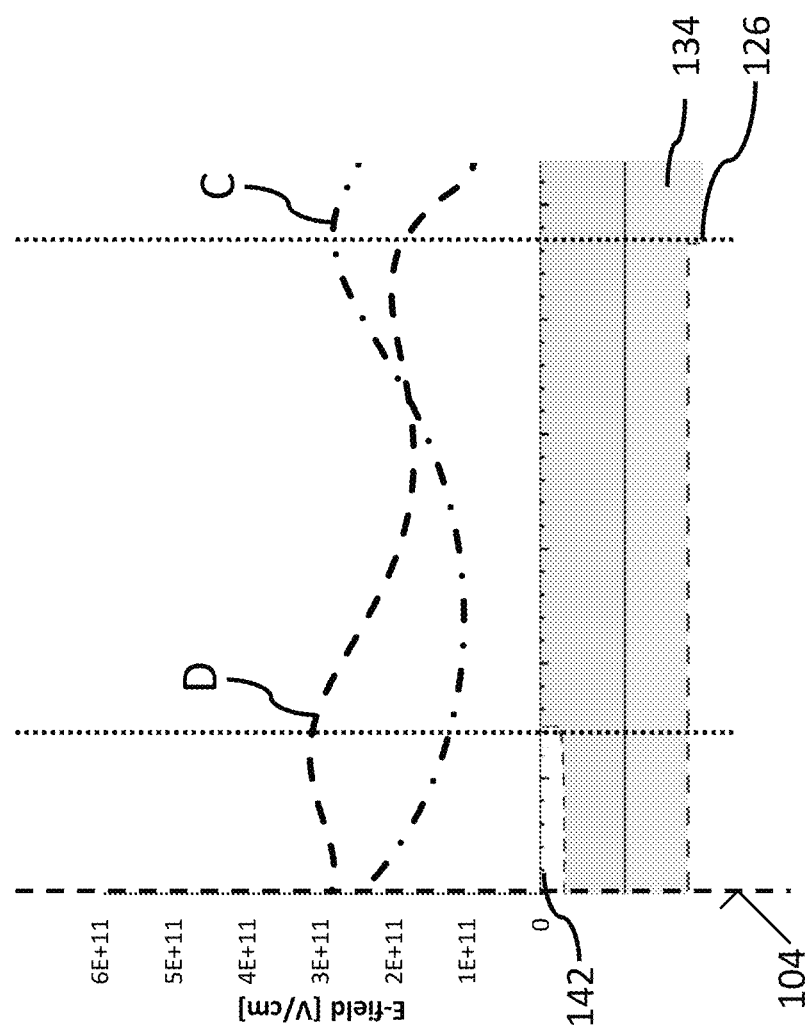
FIG. 5 depicts a comparison of an electric field present in the drift region between a device having the compensation zone and a device without the compensation zone.

FIG. 5 depicts the influence of the compensation zone 142 on a blocking-state electric field of the device 100. The blocking-state electric field is an electric field that arises in the drift region 108 around the plate trench 126 when the first p-n junction 114 is reverse biased. The dashed line C depicts a magnitude of the blocking-state electric field in a device 100 without the compensation zone 142 (i.e., the device 100 of FIG. 1) and the dashed line D depicts a magnitude of the blocking-state electric field in a device 100 having the compensation zone 142. As can be seen, the presence of the compensation zone 142 results in a maximum (i.e., peak value) in the blocking-state electric field that occurs at a location between the main surface 104 and the bottom of the field plate trench 126. More specifically, the blocking-state electric field peaks at a location corresponding to the bottom of the compensation zone 142. Further, the inclusion of the compensation zone 142 in the device 100 reduces the blocking-state electric field at a bottom of the field plate trench 126 where the blocking-state electric field curves around the field plate trench 126.

The reduced electric field at the bottom of the field plate trench 126 mitigates the likelihood of hot carrier injection between the drift region and the field plate 130, thereby improving the compensation effect of the field electrode and decreasing the likelihood of avalanche breakdown in the device 100. Thus, by arranging the compensation zone 142 in the manner depicted in FIG. 4, a favorable shift in on-resistance $R_{ON}$ versus breakdown-voltage $V_{BD}$ can be realized.

The blocking-state electric field depicted in FIG. 5 may be altered and optimized, depending upon device requirements. Various factors that will influence the shape of the blocking-state electric field include (without being limited to) the geometry of the gate trench 120, the geometry of the compensation zone 142 and the geometry of the field plates 142.

Figure 6:
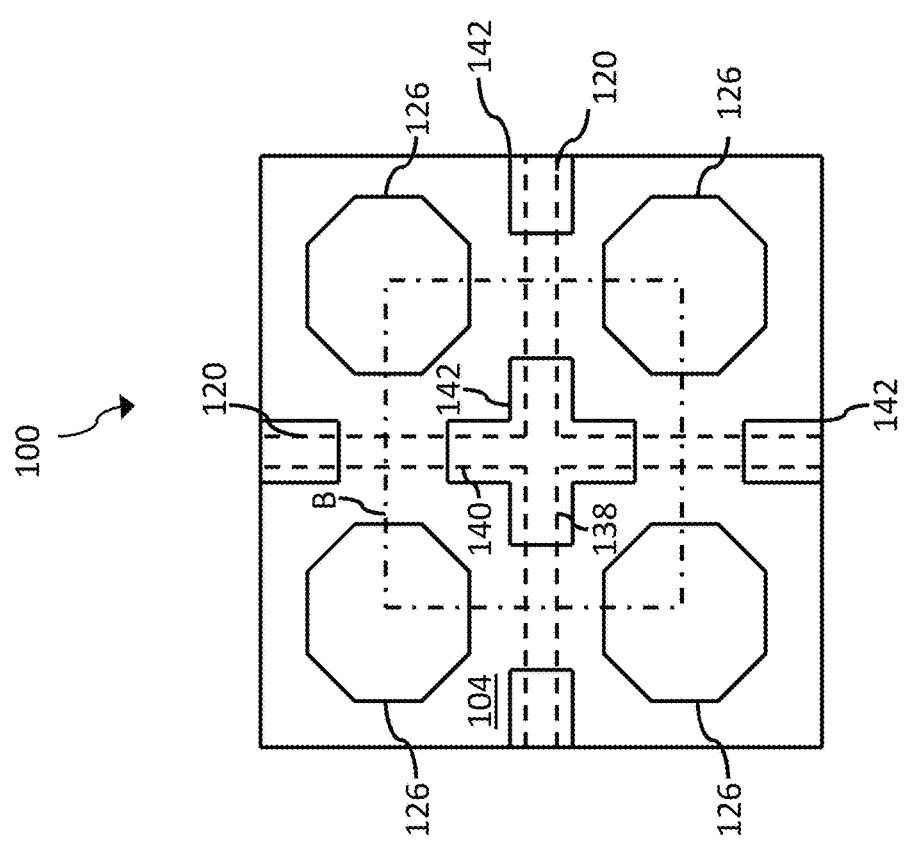
FIG. 6 depicts a plan-view configuration of the compensation zone, according to an embodiment.
Figure 7:
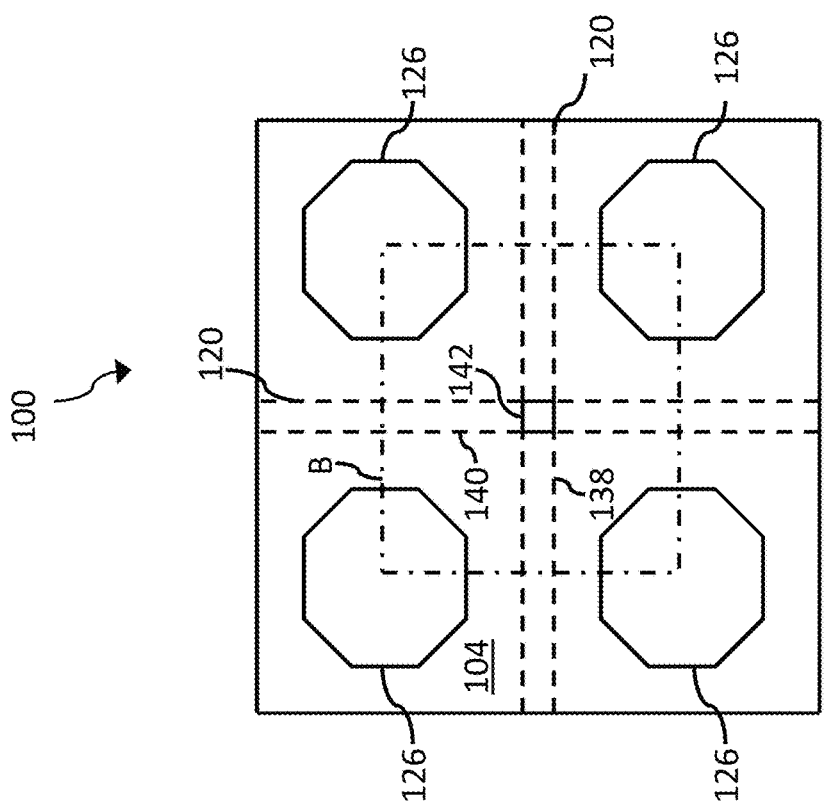
FIG. 7 depicts a plan-view configuration of the compensation zone, according to another embodiment.
Figure 8:
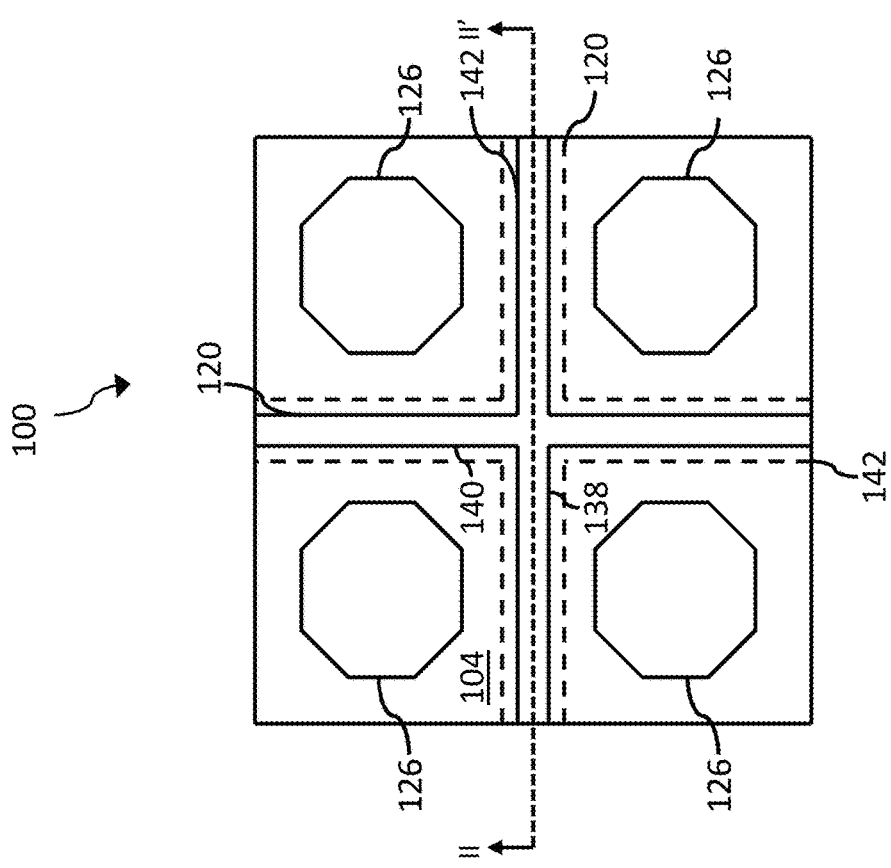
FIG. 8 depicts a plan-view configuration of the compensation zone, according to another embodiment.

FIGS. 6-8 depict various lateral configurations of the compensation zone 142 along the cross-sectional line I-I' taken in FIG. 4. Each of the figures depicts one of the cells with the lateral boundaries of the compensation zone 142 and the field plate trenches 126. The lateral boundaries of the gate trench 120 are superimposed onto the figures by dashed lines. The gate trench 120 configuration of FIG. 3 is used as an example. However, other gate trench 120 configurations, such as the trench configuration of FIG. 2, may be provided in the alternative.

In each of the embodiments of FIGS. 6-8, the compensation zone 142 is arranged underneath the portion of the gate trench 120 that is equidistant to the field plates 130. That is, the compensation zone 142 overlaps with the circle A indicated in FIGS. 2-3. Thus, the compensation zone 142 is provided in a portion of the drift region 108 that is least influenced by the field plates 130. In some cases, the compensation zone 142 is provided in other portions of the cell as well.

Referring to FIG. 6, the first, second, third and fourth field plate trenches 126 are collectively arranged in the rectangle B in the manner previously discussed with reference to FIGS. 2-3. The compensation zone 142 extends from a bottom of the portion of the gate trench 120 that is at a center of the rectangle B. In the embodiments in which the gate trench 120 includes an intersection between the first and second lateral portions 138, 140, the compensation zone 142 extends from the bottom of the gate trench 120 at the intersection.

According to an embodiment, the compensation zone 142 is electrically floating. That is, the compensation zone 142 is completely surrounded by the drift region 108 and the bottom of the gate trench 120 (which includes and electrical insulator) such that it does not connect with any other regions of the device 100. In this embodiment, the compensation zone 142 does not remain at a constant potential. This configuration is possible if there are interruptions in the compensation zone 142 outside of the center of the rectangle B, as shown in FIG. 6. In the interrupted portions of the in the compensation zone 142, the bottom of the gate trench 120 directly adjoins the drift region 108.

Alternatively, the compensation zone 142 may be electrically connected to the source potential. This connection may be provided by extending the compensation zone 142 to the body region 110 (e.g., by lateral out-diffusion). In the region of the device in which the compensation zone 142 is connected to the body region 110, there is no channel. However, in this embodiment, the channel exists in the body region 110 and connects to the drift region 108 through interrupted portions of the compensation zone 142.

According to an embodiment, the compensation zone 142 is interrupted at regions of the substrate 102 in which laterally adjacent ones of the first, second, third and fourth field plate trenches 126 are closest to one another. In the layout depicted in FIG. 6, regions of the substrate 102 in which laterally adjacent ones of the first, second, third and fourth field plate trenches 126 are closest to one another correspond to the boundaries of the rectangle B. By interrupting the compensation zone 142 in these regions, the field plate trenches 126 can be spaced closer to one another, and closer to the gate trench 120. If the field plate trenches 126 are too close to the compensation zone 142, the presence of the compensation zone 142 could lead to a non-negligible reduction in on-resistance $R_{ON}$. That is, if the compensation zone 142 occupies a significant portion of the drift region 108, it may inhibit current flow. Thus, depending on how the device 100 is configured, the incorporation of the compensation zone 142 into the device 100 may require a buffer distance between the compensation zone 142 and the field plate trenches 126. The configuration of FIG. 6 allows for a reduction in this buffer distance because the compensation zone 142 is not provided in locations in which the field plate trenches 126 are closest to the gate trench 120.

Referring to FIG. 7, an alternate configuration of the compensation zone 142 is depicted. In this embodiment, the compensation zone 142 extends from the bottom of the gate trench 120 only at the intersection. The compensation zone 142 does not extend from the bottom of the gate trench 120 in the rest of the first and second lateral portions 138, 140 outside of the intersection.

FIG. 8 depicts a configuration in which the compensation zone 142 extends continuously along both of the first and second lateral portions 138, 140, and is not interrupted. The compensation zone 142 of FIG. 8 may be electrically floating or alternatively may be connected to a potential. In this embodiment, the compensation zone 142 may be coupled to the source potential (i.e., the same potential that the source region 110 is connected to) at a region of the substrate 102 outside of the cell region. This connection provides a conduction path for charges to flow into the compensation zone 142 and therefore improves the compensation effect of the compensation zone 142.

Although the field plate trenches 126 depicted are configured in the rectangle B, other configurations are possible, and the compensation zone 142 described herein may be used in conjunction with these configurations. For example, the field plate trenches 126 may be configured in a pentagon, hexagon, etc., and the compensation zone 142 may be provided underneath the gate trenches 120 in the manner disclosed in FIGS. 6-8.

Figure 9:
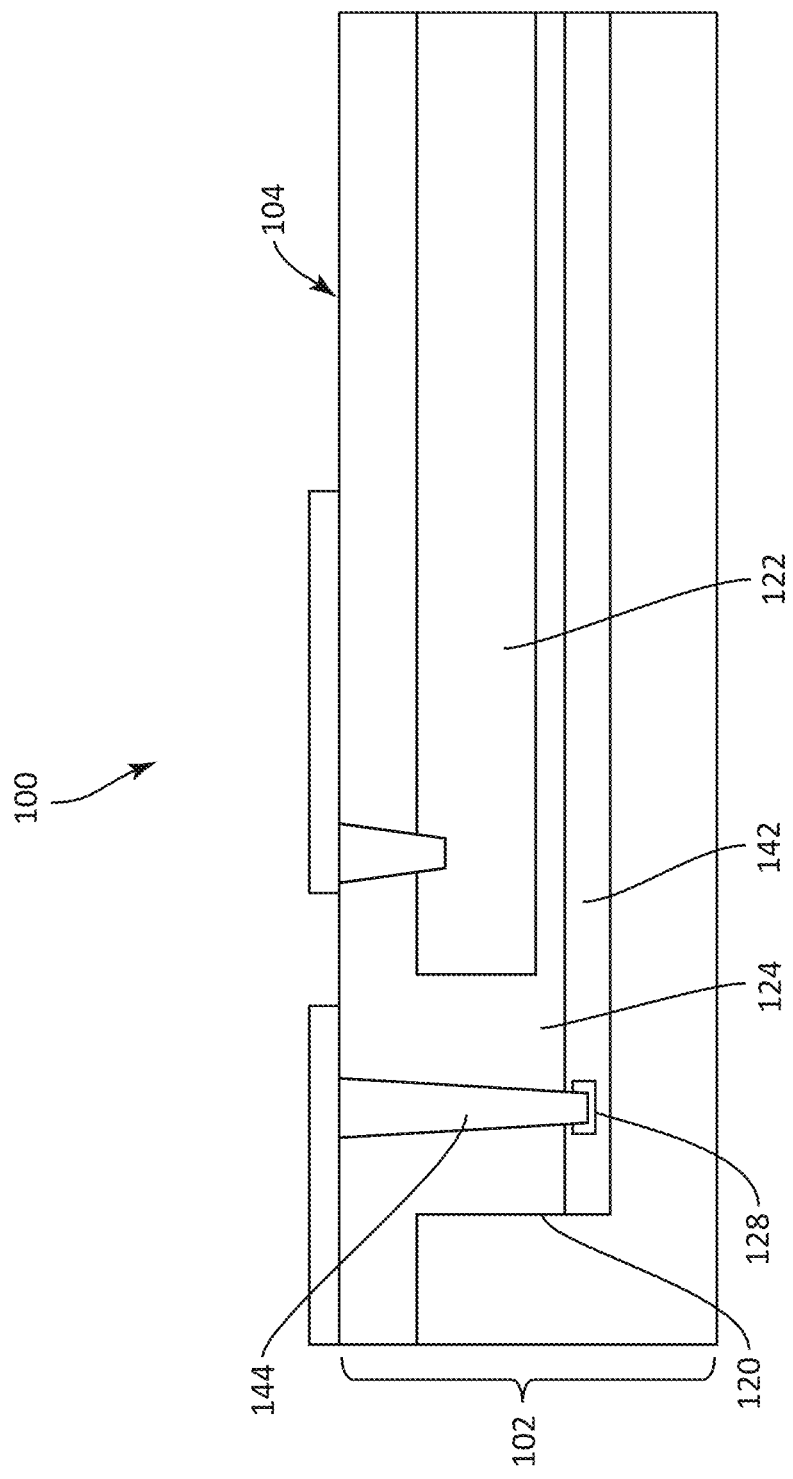
FIG. 9 depicts cross-sectional view of the semiconductor device having a contact structure for contacting the compensation zone to an external electrode, according to an embodiment.

FIG. 9 depicts a potential configuration for electrically connecting the compensation zone 142 to an external terminal, such as a source terminal. FIG. 9 is a cross-sectional view of the substrate 102 along the gate trench 120, as represented by the dashed line II-II' depicted in FIG. 8. The view of FIG. 9 depicts a section of the substrate 102 that is outside of one of the cell region depicted in FIG. 8. In this region of the substrate 102, the gate electrode 122 and the gate trench 120 terminate. The gate trench 120 laterally extends beyond an end of the gate electrode 122 such that there is a lateral region of the gate trench 120 in which only the gate dielectric 124 is provided. In this lateral region, a contact 144 extends from the main surface 104 to the compensation zone 142. Thus, a contact that is laterally adjacent to the end of the gate electrode 122 extends through the gate trench 120 and provides the electrical connection between the compensation zone 142 and a source electrode. Optionally, the compensation region may include a highly doped region 128 to prove a low-ohmic connection with the contact 144.

Figure 10:
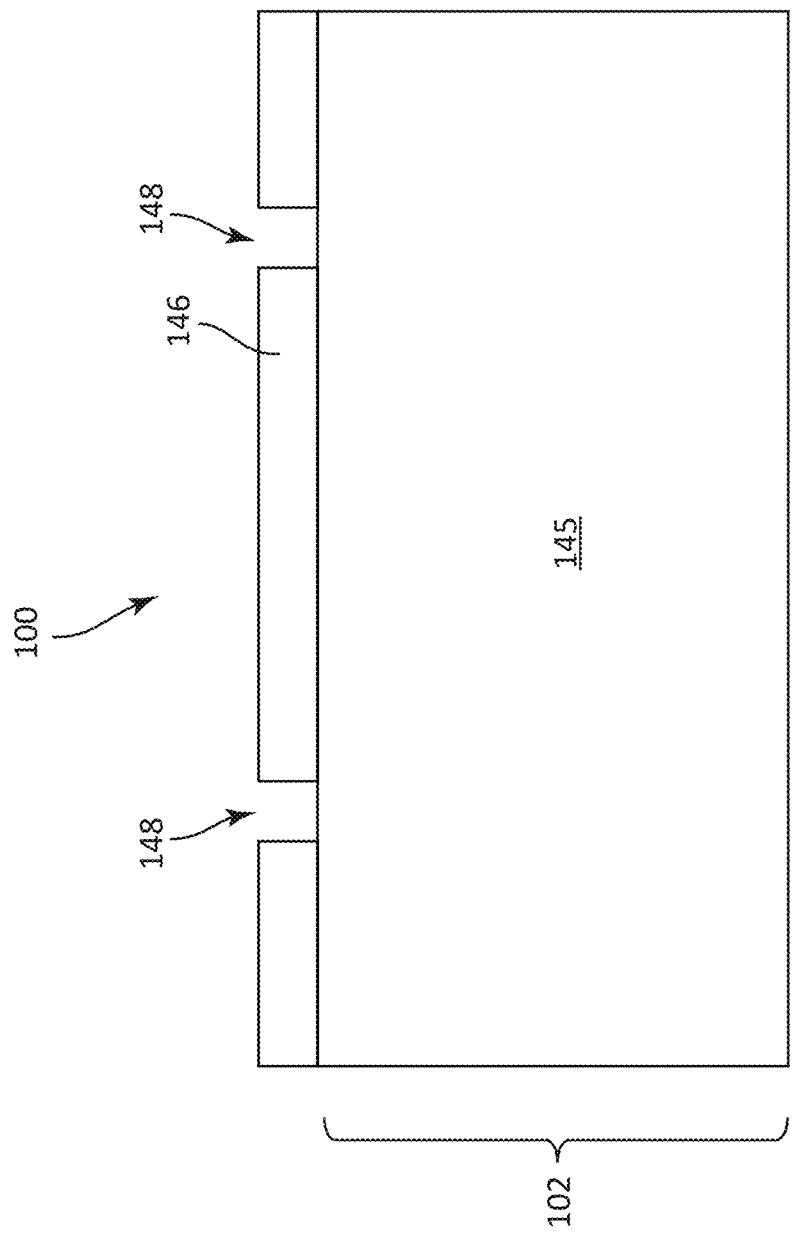
FIGS. 10-13 depict a process sequence for forming self-aligning gate trenches and compensation zones in a semiconductor substrate, according to an embodiment.

FIGS. 10-13 depict selected processing steps in a method of forming the device 100 described herein. Referring to FIG. 10, a semiconductor substrate 102 is formed. The semiconductor substrate 102 may consist of or include one or more of a variety of semiconductor materials that are used to form integrated circuit devices, such as silicon (Si), silicon carbide (SiC), germanium (Ge), a silicon germanium crystal (SiGe), gallium nitride (GaN), gallium arsenide (GaAs), and the like. The semiconductor substrate 102 may be a bulk semiconductor material or alternatively may include one or more epitaxially grown layers. According to an embodiment, the substrate 102 includes an epitaxially grown layer 144 of n-type silicon, which eventually forms the drift region 108 of the device 100.

A mask 146 is formed on the substrate 102. The mask 146 may be a relatively thick layer of oxide, such as TEOS (tetraethyl orthosilicate). The mask 146 is patterned with openings 148 so as to uncover portions of the substrate 102. The mask 146 can be patterned to form the desired geometry of the gate trench 120. For instance, the geometry of the gate trench 120 FIG. 3 can be realized patterning the mask 146 such that it includes openings 148 with lateral portions that extend in orthogonal directions and intersect with one another.

Figure 11:
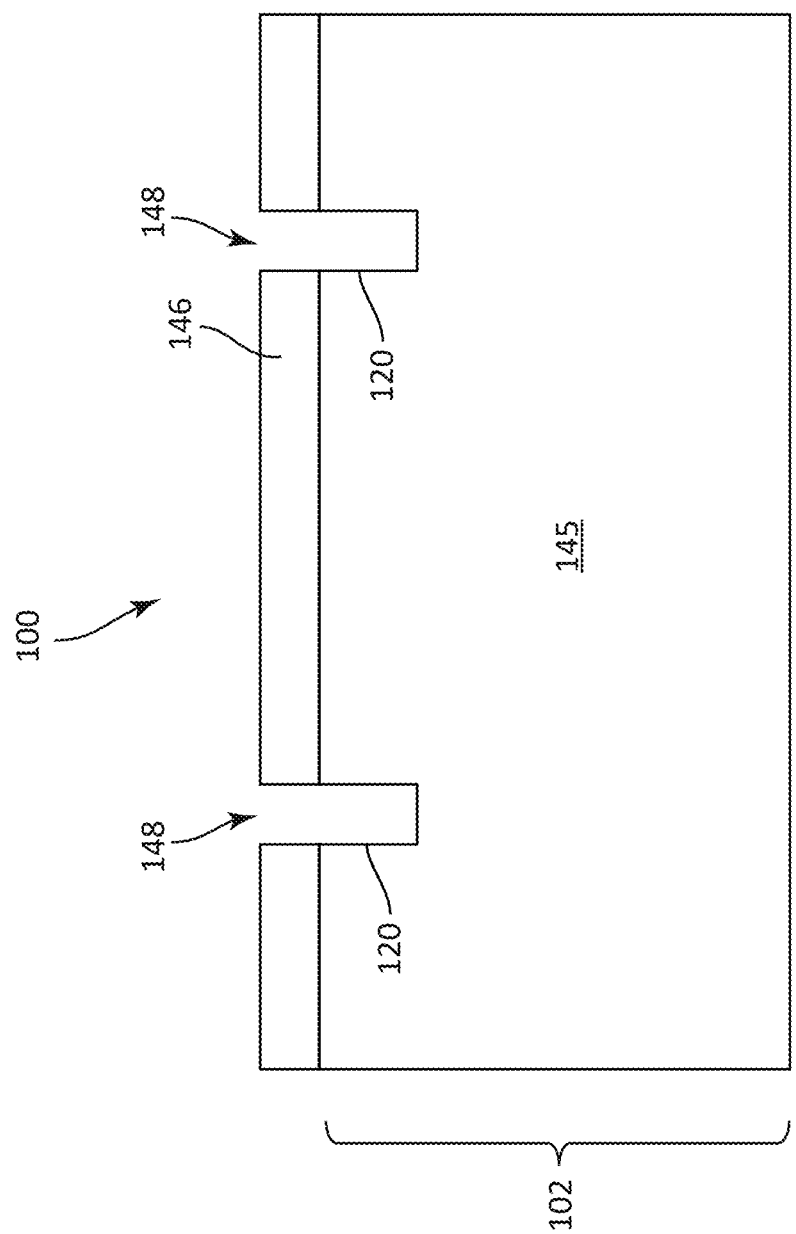

Referring to FIG. 11, portions of the substrate 102 that are uncovered by the mask 146 are etched away to form the gate trench 120. This etching process may be a wet-chemical etch process, for example.

Figure 12:
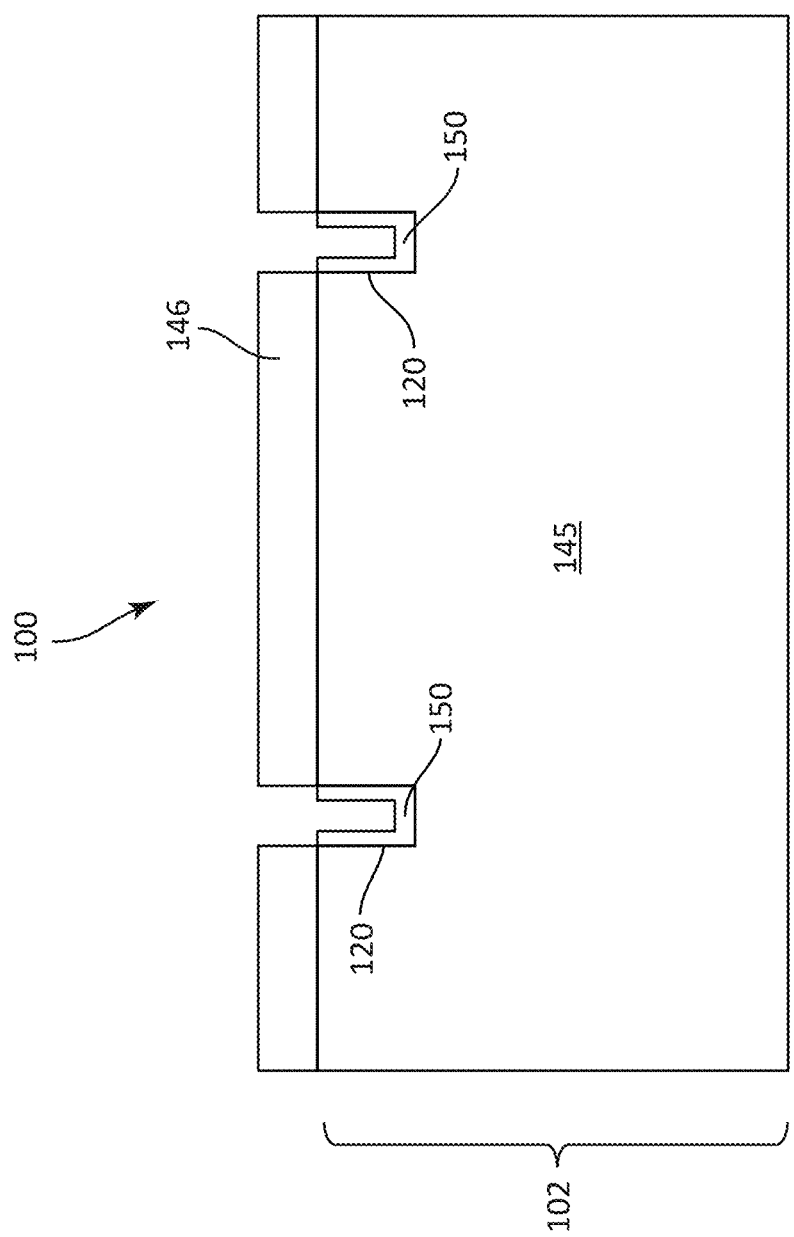

Referring to FIG. 12, a sacrificial oxide layer 150 is formed the bottom of the gate trench 120. The sacrificial oxide layer 150 may be a layer of silicon dioxide ($SiO_2$) that is formed by a deposition technique, for example.

Figure 13:
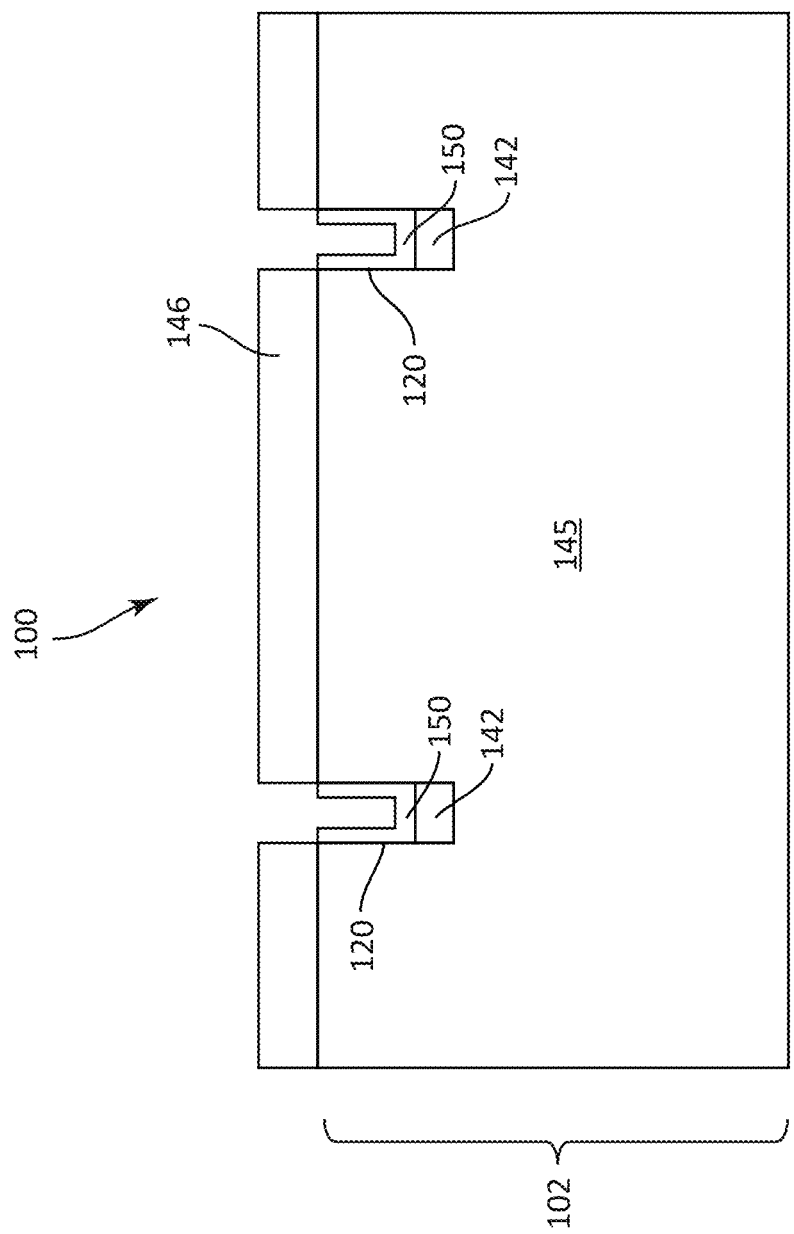

Referring to FIG. 13, dopants are implanted into the substrate 102 using the sacrificial oxide layer 150 as a scattering layer. The thickness of the sacrificial oxide layer 150 is such that dopant atoms are able to penetrate through the sacrificial oxide layer 150 and disperse into the substrate 102 beneath the bottom of the gate trench 120. Using the sacrificial oxide layer 150 increases the size of the compensation zones 142 and improves the uniformity of the doping concentration in comparison to a technique that does not utilize the sacrificial oxide layer 150. Further, the sacrificial oxide layer 150 is configured to prevent substantial implantation of the dopant atoms along the sidewalls of the gate trench 102.

The sacrificial oxide layer 150 can be relatively thin in comparison to the mask 146 such that the dopant atoms penetrate the sacrificial oxide layer 150 but not the mask 146. According to an embodiment, the sacrificial oxide layer 150 has a thickness of between 5 and 50 nm, such as 15 nm and the mask 146 has a thickness of between 100-1000 nm, such as 350 nm. By providing the different thickness of the mask 146 and the sacrificial oxide layer 150, it is possible to form the compensation zones 142 at the bottom of the gate trench 120 while masking the rest of the substrate 102 from the dopants that are used to form the compensation zones 142.

The lateral geometry of the compensation zones 142 may be controlled using masking techniques. For example, the configuration of the compensation zone 142 depicted in FIG. 6 can be provided by forming a further mask on the substrate 102, wherein the further mask covers portions of the gate trench 120 outside of the intersection. These covered portions of the gate trench 120 correspond to the interruptions in the compensation zones 142.

Advantageously, the processing technique described with reference to FIGS. 10-13 allows for the formation of the device 100 in a cost effective manner and with tight process tolerances. Because the mask 146 is used to form both the gate trenches 120 and the compensation zones 142, the processing costs are minimized. Furthermore, the compensation zones 142 are self-aligned with the gate trenches 120. That is, the compensation zones 142 are laterally aligned with the gate trenches 120 due to the common mask that is used to form both device structures. Therefore, the compensation zones 142 can be produced underneath the gate trenches 120 with a high degree of precision.

After the implantation of the dopants to form the compensation zones 142, the sacrificial oxide layer 150 may be removed. The rest of the above described features of the device 100 (e.g., the gate electrode 122, gate dielectric 124, source and body regions 112, 110 etc.) may be formed using conventionally known techniques.

The device 100 is illustrated and described an n-channel MOSFET for exemplary purposes only. A variety of different device types may be implemented with the charge-compensation structures (i.e., the field plate trenches 126 and compensation zone 142) described herein. For example, the conductivity type of the body, source and drain regions may be reversed so that the device 100 is a p-channel MOSFET. The device 100 may be an enhancement mode or depletion mode device. The device 100 is not necessarily a MOSFET, and may be implemented as any other another kind of active semiconductor device such as a diode, thyristor, IGBT, etc.

As used herein, a "vertical direction" and corresponding directional descriptors such as "vertically extending" refer to a direction that is perpendicular to the main and rear surfaces 104, 106 of the substrate 102. A "lateral direction" and corresponding directional descriptors such as "laterally extending" refer to a direction that is parallel the main and rear surfaces 104, 106 of the substrate 102 and perpendicular to the vertical direction.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the conductivity type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The formed semiconductor device is typically a vertical semiconductor device such as a vertical MOSFET with a source metallization arranged on the first surface, an insulated gate electrode arranged in a vertical trench next to the first surface and a drain metallization arranged on a second surface which is opposite to the first surface. Typically, the formed semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

Spatially relative terms such as "under," "below," "lower," "over," "upper" and the like, are used for ease of description to explain the positioning of one element relative to a second element. These terms are intended to encompass different orientations of the device 100 in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, the method comprising:

forming a semiconductor substrate comprising a main surface and a rear surface vertically spaced apart from the main surface, a first doped region, a second doped region and a third doped region, the second and third doped regions being formed in the first doped region, the second doped region extending from the main surface into the substrate, the third doped region interposed between the first and second doped regions beneath the main surface;

forming first and second field plate trenches vertically extending from the main surface to a bottom that is arranged in the first doped region;

forming first and second field plates arranged in the first and second field plate trenches, respectively, and being dielectrically insulated from the substrate;

forming a gate trench laterally arranged between the first and second field plate trenches and vertically extending from the main surface through the second and third doped regions so that the gate trench has a bottom arranged in the first doped region;

forming a gate electrode arranged in the gate trench and being dielectrically insulated from the substrate, the gate electrode being configured to control an electrically conductive channel in the third doped region; and forming a compensation zone vertically extending from the bottom of the gate trench deeper into the first doped region, wherein the compensation zone is laterally aligned with the gate trench along a cross-sectional plane of the device that is parallel to the main surface, wherein the compensation zone is adjacent to the field plates along a cross-sectional plane of the device that is parallel to the main surface, wherein the first and second doped regions have a first conductivity type, wherein the third doped region and the compensation zone have a second conductivity type, and wherein forming the compensation zone comprises: implanting dopants through a sacrificial oxide layer at the bottom of the gate trench, and wherein an oxide mask is provided on the main surface during the implanting of the dopants, wherein the dopants are substantially prevented from penetrating the main surface by the oxide mask.

2. The method of claim 1, wherein forming the gate trench comprises:

forming the oxide mask having a first thickness on the main surface; and etching portions of the substrate that are uncovered by the oxide mask.

3. The method of claim 2, wherein forming the compensation zone comprises:

forming the sacrificial oxide layer at the bottom of the gate trench having a second thickness; and implanting dopants through the sacrificial oxide layer while the oxide mask is arranged on the main surface, wherein the first thickness is greater than the second thickness.

4. The method of claim 3, wherein the oxide mask is configured to form first and second lateral portions of the gate trench that are orthogonal to one another and form an intersection in the substrate, and wherein forming the compensation zone comprises:

covering the first and second lateral portions of the gate trench outside of the intersection during implanting of the dopants using a further mask such that the compensation zone is interrupted outside of the intersection.

5. The method of claim 1, wherein only the gate electrode and a gate dielectric are arranged in the gate trench, and wherein a bottom of the compensation zone is spaced closer to the main surface than the bottoms of the first and second field plate trenches.

6. The method of claim 1, further comprising:

forming third and fourth field plate trenches extending from the main surface to a bottom that is arranged in the first doped region; and forming third and fourth field plates in the third and fourth field plate trenches, respectively, and being dielectrically insulated from the substrate, wherein the gate electrode is laterally arranged between third and fourth field plate trenches from a plan view perspective of the main surface, and wherein the compensation zone is arranged underneath a portion of the gate trench that is equidistant to the first, second, third and fourth field plates.

7. The method of claim 6, wherein the first, second, third and fourth field plate trenches each form a closed loop in a plane parallel to the main surface, wherein the first, second, third and fourth field plate trenches are collectively arranged in a rectangle, the rectangle being formed in the plane parallel to the main surface and being defined by center points of the closed loops, and wherein the portion of the gate trench that is equidistant to the first, second, third and fourth field plates is at a center of the rectangle.

8. The method of claim 7, wherein the gate trench comprises first and second lateral portions that form an intersection with one another at the center of the rectangle, and wherein the compensation zone extends from the bottom of the gate trench at the intersection.

9. The method of claim 8, wherein the first and second lateral portions of the gate trench are orthogonal to one another.

10. The method of claim 8, wherein the compensation zone is interrupted at regions of the substrate in which laterally adjacent ones of the first, second, third and fourth field plate trenches are closest to one another.

11. The method of claim 8, wherein the compensation zone extends from the bottom of the gate trench only at the intersection.

12. A method of forming a semiconductor device, the method comprising:

forming a semiconductor substrate comprising a main surface and a rear surface vertically spaced apart from the main surface, a first doped region, a second doped region and a third doped region, the second and third doped regions being formed in the first doped region, the second doped region extending from the main surface into the substrate, the third doped region interposed between the first and second doped regions beneath the main surface;

forming first and second field plate trenches vertically extending from the main surface to a bottom that is arranged in the first doped region;

forming first and second field plates arranged in the first and second field plate trenches, respectively, and being dielectrically insulated from the substrate;

forming a gate trench laterally arranged between the first and second field plate trenches and vertically extending from the main surface through the second and third doped regions so that the gate trench has a bottom arranged in the first doped region;

forming a gate electrode arranged in the gate trench and being dielectrically insulated from the substrate, the gate electrode being configured to control an electrically conductive channel in the third doped region;

forming a compensation zone vertically extending from the bottom of the gate trench deeper into the first doped region, and forming a contact which extends through the gate trench and electrically couples the compensation zone to the second doped region, the contact being laterally adjacent to an end of the gate electrode,
wherein the compensation zone is laterally aligned with the gate trench along a cross-sectional plane of the device that is parallel to the main surface,
wherein the compensation zone is adjacent to the field plates along a cross-sectional plane of the device that is parallel to the main surface,
wherein the first and second doped regions have a first conductivity type,
wherein the third doped region and the compensation zone have a second conductivity type.

* * * * *